United States Patent
Tikka et al.

(10) Patent No.: US 6,462,460 B1
(45) Date of Patent: Oct. 8, 2002

(54) METHOD AND SYSTEM FOR WAFER-LEVEL TUNING OF BULK ACOUSTIC WAVE RESONATORS AND FILTERS

(75) Inventors: Pasi Tikka, Helsinki (FI); Juha Ellä, Halikko (FI); Jyrki Kaitila, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/844,218

(22) Filed: Apr. 27, 2001

(51) Int. Cl.[7] ............................................... H01L 41/08
(52) U.S. Cl. ....................................... 310/312; 310/311
(58) Field of Search ................................ 310/311, 312, 310/328, 367

(56) References Cited

U.S. PATENT DOCUMENTS

| | | | |
|---|---|---|---|
| 4,638,536 | * 1/1987 | Vig | 29/25.35 |
| 5,789,845 | * 8/1998 | Wadaka et al. | 310/311 |
| 6,081,171 | 6/2000 | Ella | 333/189 |
| 6,111,341 | * 8/2000 | Hirama | 310/312 |
| 6,307,447 | * 10/2001 | Barber et al. | 29/25.35 |
| 2001/0038255 | * 11/2001 | Wadaka et al. | 310/313 R |

* cited by examiner

*Primary Examiner*—Thomas M. Dougherty
(74) *Attorney, Agent, or Firm*—Ware, Fressola, Van Der Sluys & Adolphson LLP

(57) ABSTRACT

A method and system for tuning a bulk acoustic wave device at wafer level, wherein the thickness of topmost layer of the device is non-uniform. The thickness non-uniformity causes the resonant frequency of the device to vary from one location to another location of the topmost layer. A laser beam, operatively connected to a beam moving mechanism, is used to locally trim the topmost layer, one location at a time.

16 Claims, 5 Drawing Sheets

METHOD AND SYSTEM FOR WAFER-LEVEL TUNING OF BULK ACOUSTIC WAVE RESONATORS AND FILTERS

FIELD OF THE INVENTION

The present invention relates generally to bulk acoustic wave resonators and filters and, more particularly, to the tuning of such resonators and filters.

BACKGROUND OF THE INVENTION

It is known that a bulk acoustic-wave (BAW) device is, in general, comprised of a piezoelectric layer sandwiched between two electronically conductive layers that serve as electrodes. When a radio frequency (RF) signal is applied across the device, it produces a mechanical wave in the piezoelectric layer. The fundamental resonance occurs when the wavelength of the acoustically generated wave is about twice the thickness of the piezoelectric layer. Although the resonant frequency of a BAW device also depends on other factors, the thickness of the piezoelectric layer is the predominant factor in determining the resonant frequency. As the thickness of the piezoelectric layer is reduced, the resonant frequency is increased. BAW devices have traditionally been fabricated on sheets of quartz crystals. In general, it is difficult to achieve a device of high resonant frequency using this fabrication method. Fabricating BAW devices by depositing thin-film layers on passive a substrate materials, one can extend the resonant frequency to the 0.5–10 GHz range. These types of BAW devices are commonly referred to as thin-film bulk acoustic resonators or FBARs. There are primarily two types of FBARs, namely, BAW resonators and stacked crystal filters (SCFs). The difference between these two types of devices lies mainly in their structures. An SCF usually has two or more piezoelectric layers and three or more electrodes, with some electrodes being grounded. FBARs are usually used in combination to produce passband or stopband filters. The combination of one series FBAR and one shunt FBAR makes up one section of the so-called ladder filter. The description of ladder filters can be found, for example, in Ella (U.S. Pat. No. 6,081,171). As disclosed in Ella, a FBAR-based device may have one or more protective layers commonly referred to as the passivation layers. A typical FBAR-based device is shown in FIG. 1. As shown in FIG. 1, the FBAR device 1 comprises a substrate 2, a bottom electrode 4, a piezoelectric layer 6, a top electrode 8 and a passivation layer 10. The FBAR device 1 may additionally include an acoustic mirror layer 12, which is comprised of a layer 16 of high acoustic impedance sandwiched between two layers 14 and 18 of low acoustic impedance. The mirror usually, but not always, consists of pairs of high and low impedance layers (even number of layers). Some mirrors consist of two pairs of such layers arranged in a sequence like SiO2, W, SiO2, W. Instead of the mirror, an FBAR device may additionally include one or more membrane layers of SiO2 and a sacrificial layer. The substrate 2 can be made from silicon (Si), silicon dioxide (SiO2), Galium Arsenide (GaAs), glass, or ceramic materials. The bottom electrode 4 and top electrode 8 can be made from gold (Au), molybdenum (Mo), aluminum (Al), titanium (Ti) or other electrically conductive materials. The piezoelectric layer 6 can be made from zinc oxide (ZnO), zinc sulfide (ZnS), aluminum nitride (AlN), lithium tantalate (LiTaO$_3$) or other members of the so-called lead lanthanum zirconate titanate family. The passivation layer can be made from SiO2, Si3N4 or polyimide. The low acoustic impedance layers 14 and 18 can be made from Si, SiO2, poly-silicon, Al or a polymer. The high acoustic impedance layer 16 can be made from Au, Mo or tungsten (W), and in some cases, dielectric such as AlN to make a number of layer pairs. FBAR ladder filters are typically designed so that the series resonators yield a series resonance at a frequency that is approximately equal to, or near, the desired, or designed, center frequency of the respective filters. Similarly, the shunt, or parallel, resonators yield a parallel resonance at a frequency slightly offset from the series FBAR resonance. The series resonators are usually designed to have their maximum peak in transmission at the center frequency, so that signals are transmitted through the series resonators. In contrast, the shunt resonators are designed to have their minimum in transmission so that signals are not shorted to ground. FBARs yield parallel resonance and series resonance at frequencies that differ by an amount that is a function of a piezoelectric coupling coefficient of the piezoelectric materials used to fabricate the devices, in addition to other factors such as the types of layers and other materials employed within in the device. In particular, FBAR ladder filters yield passbands having bandwidths that are a function of, for example, the types of materials used to form the piezoelectric layers of the resonators and the thickness of various layers in the device.

The difference in the thickness of various layers in the device can be achieved during the fabrication of the device. Presently, FBARs are fabricated on a glass substrate or a silicon wafer. The various layers in the FBAR-based device are sequentially formed by thin-film deposition. In an FBAR-based device, the resonant frequency of the device usually has to be controlled to within a 0.2–0.5% tolerance. This means that, if no tuning is used, the thickness of each layer in the device must be controlled in a similar way. It is known that, however, the deposition of thin-film layers is difficult to control to yield a thickness within such tolerance when the area of substrate or wafer is large. With a small wafer or substrate, certain thickness non-uniformity can be accepted without losing many components due to the operation frequency being out of specification. However, fabricating devices on small wafers or substrates is less cost-effective than doing the same on large substrates. In the case of using large substrates, the problem associated with thickness non-uniformity becomes acute.

Thus, it is advantageous and desirable to provide a method and system to solve the problem associated with thickness non-uniformity in the fabrication of FBAR-based devices on large substrates or wafers.

SUMMARY OF THE INVENTION

It is a primary object of the present invention to provide a method and system for achieving a desired resonant frequency of the bulk acoustic wave device within a given tolerance. This object can be achieved by reducing the thickness non-uniformity of the device on a substrate. The thickness non-uniformity can be reduced by selectively and locally removing material from the topmost surface layer of the wafer, or die, before the wafer is cut into a plurality of device chips. Thus, the wafer has one or more bulk acoustic wave generating and controlling layers formed thereon. In that context, the bulk acoustic wave device, as described herein, refers to the entire wafer or substrate that has one or more layers fabricated thereon to form one or more individual device chips, or part of such wafer or substrate. Moreover, the bulk acoustic wave devices referred to herein include bulk acoustic wave resonators, bulk acoustic wave filters, stacked crystal filters, any combination of resonators and filters, and the structural variations of the resonators and filters. Furthermore, although one or more layers are already formed on the wafer or substrate when the thickness non-uniformity of the topmost layer is reduced, the device may or may not have all the necessary layers or the patterns of the layers. For example, the topmost layer of the device can be a piezoelectric layer. In that case, one or more layers are added on to the adjusted layer to complete the device.

Thus, according to the first aspect of the present invention, a method of tuning a bulk acoustic wave device made of a plurality of acoustic wave generating and controlling layers formed on a substrate, wherein the bulk acoustic wave device has a surface layer and a surface layer thickness having a non-uniformity profile defining a plurality of locations at which the surface layer requires thickness adjustment, and wherein the bulk acoustic wave device has an operating frequency which varies partly with the surface layer thickness, and the operation frequency can be adjusted by adjusting the surface layer thickness. The method comprises the steps of:

provising an etching medium over the surface layer at one section thereof for locally adjusting the thickness of at least one location of the surface layer at a time;

relocating the etching medium to another section of the surface layer for adjusting the thickness of at least one other location of the surface layer; and repeating the relocating step if at least one remaining location of the surface layer requires thickness adjustment.

Preferably, the etching medium is a laser beam.

When the surface layer comprises a plurality of individual bulk acoustic wave components each having a top surface located at one of the locations, it is preferable to use a laser beam to trim the top surface of the individual bulk acoustic wave components, one at a time. The top surface can be a piezoelectric layer, a top electrode layer, a bottom electrode layer, a passivation layer overlapping the active area of the device, or a combination of thereof. For example, the top surface may include a piezoelectric layer and a top electrode layer.

Each of the individual bulk acoustic wave components may be a part of resonator, filter, stacked crystal filter or a combination thereof.

Preferably, the method further comprises the step of mapping the thickness non-uniformity of the surface layer prior to adjusting the thickness thereof.

According to the second aspect of the present invention, a system for tuning a bulk acoustic wave device made of a plurality of acoustic wave generating and controlling layers formed on a substrate, wherein the bulk acoustic wave device has a surface layer made of a surface material, and a surface layer thickness having a non-uniformity profile defining a plurality of locations at which the surface layer requires thickness adjustment, and wherein the bulk acoustic wave device has an operating frequency, which varies partly with the surface layer thickness, and the operation frequency can be adjusted by adjusting the layer thickness. The system comprises:

means, positioned above a section of the surface layer, for adjusting locally the thickness of at least one location of the surface layer at a time; and means for relocating the thickness adjusting means, relative to the device, to another section of the surface layer for adjusting the thickness of at least one other location of the surface layer.

Preferably, the thickness adjusting means comprises a laser for providing a laser beam for removing the surface material.

Preferably, the system further comprises means for mapping the thickness non-uniformity profile of the surface layer prior to adjusting the thickness thereof.

It is understood that if the thickness of the piezoelectric layer is adjusted according to the above-described method, then a top electrode layer is deposited on the piezoelectric layer after the thickness of the piezoelectric layer is adjusted. It may also be necessary to adjust the thickness of the top electrode layer using the same method. Additionally, a patterning step is usually necessary to produce a desired pattern for the electrode layer. The patterning step can be carried out before or after the thickness of the electrode layer is adjusted. The patterning step is not part of the present invention. Furthermore, if a passivation layer is deposited on top of the top electrode layer, it may be necessary to adjust the thickness of the passivation layer. Thus, the thickness adjustment steps, according to the present invention, may be carried out one or more times for tuning the entire device, if necessary.

It is understood that, the relocation means can also be used to relocate the device, relative to the thickness adjusting means.

The present invention will become apparent upon reading the description taken in conjunction with FIGS. 2 to 7.

DETAILED DESCRIPTION OF THE INVENTION

Figure 1:
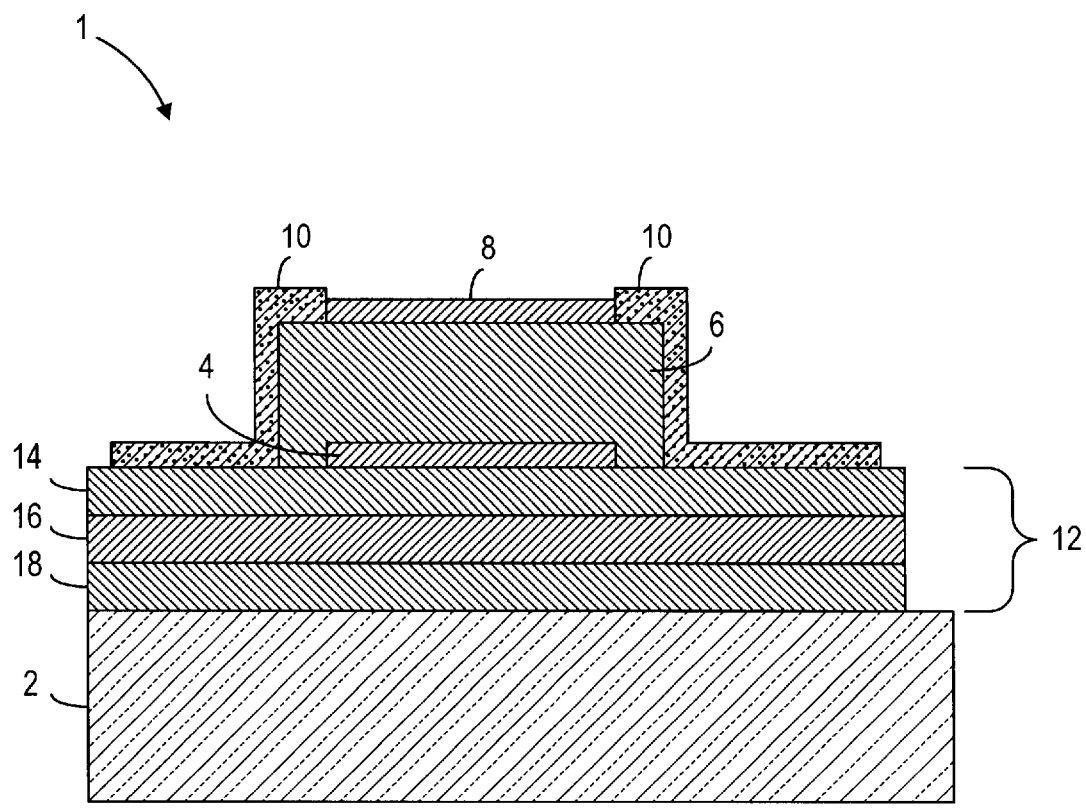
FIG. 1 is a cross sectional side view of a typical bulk acoustic wave device illustrating a plurality of bulk acoustic wave generating and controlling layers.
Figure 2:
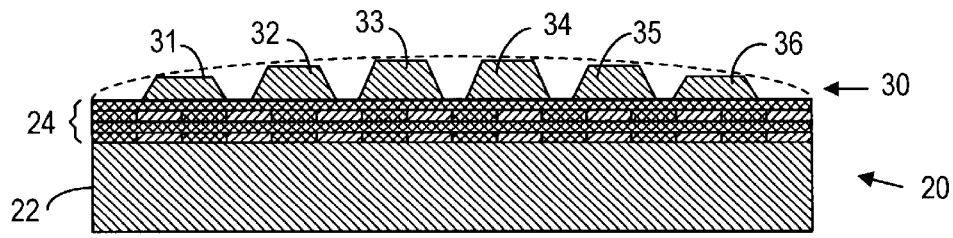
FIG. 2 is a diagrammatic representation illustrating a simplified bulk acoustic wave device comprising a surface layer with a plurality of locations at which the surface layer requires thickness adjustment.

FIG. 2 shows a bulk acoustic wave device 20 at wafer level, wherein the device 20 has a plurality of bulk acoustic wave generating and controlling layers formed on a wafer or substrate 22. The topmost layer is denoted by reference numeral 30 and the underlying layers are collectively denoted by reference numeral 24. For example, the underlying layers 24 may comprise a plurality of mirror layers, some of which are patterned. The top layer 30 may comprise a plurality of individual bulk acoustic components having top and bottom electrodes, but the top layer 30 may represent a piezoelectric layer, a bottom electrode layer or a top electrode layer. If the wafer is sufficiently large and the layers are fabricated by vacuum deposition, usually the thickness of the layers is non-uniform (see FIG. 6). The thickness non-uniformity of the top surface layer 30 may exceed the tolerance allowed for the spread in the resonant frequency of the device 20. Thus, it is desirable to remove part of the top surface layer 30 so that the non-uniformity of the reduced surface falls within the tolerance. To illustrate the problem associated with the thickness non-uniformity of the top surface layer 30, a plurality of individual bulk acoustic wave components 31–36 with different thicknesses are shown in FIG. 2. The individual bulk acoustic wave components 31–36 can be resonators (or filters, stacked crystal filters or a combination thereof). The thickness non-uniformity profile of the top surface layer 30, however, can be reduced by reducing the thickness of some of the resonators so that the spread in the resonant frequency falls within the tolerance.

Figure 3:
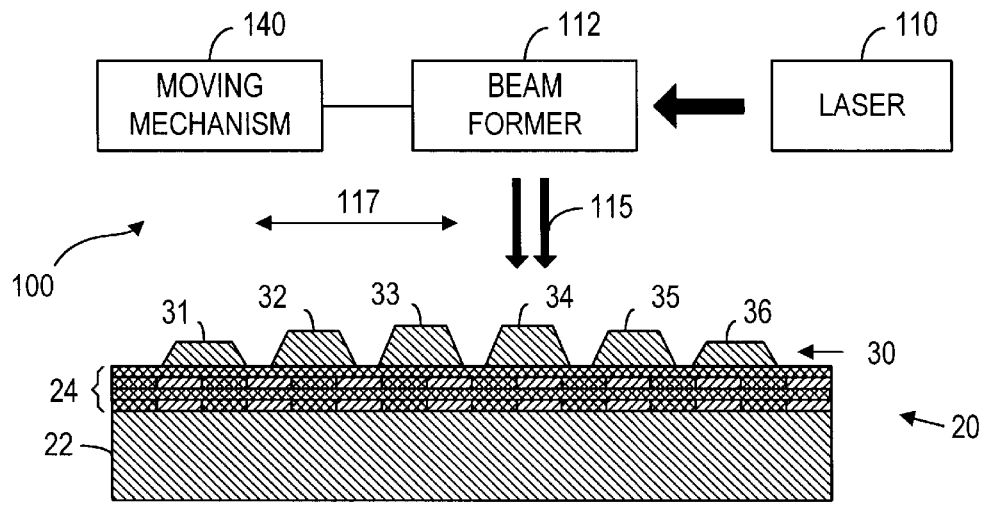
FIG. 3 is a diagrammatic representation illustrating a system for removing material from the surface layer of the bulk acoustic wave device at wafer level, according to the preferred embodiment of the present invention.

A system 100 for reducing the thickness non-uniformity profile of the top surface layer 30 is shown in FIG. 3. As shown, a laser 110 is used to provide a laser beam to a beam forming device 112 so that the output beam 115 can be used to locally reduce the thickness of some of the resonators 31–36, one at a time. A beam moving mechanism 140 is used to move the laser beam 115 in a lateral direction 117 to different locations for trimming the resonators. For example, if it is desirable to trim only the resonators 32–35, then it is only necessary to relocate the laser beam 115 by the moving mechanism 140 to the corresponding locations. It is also possible to use a similar moving mechanism to relocate the device 20 to different locations for trimming, while keeping the laser beam 115 stationary.

Figure 4:
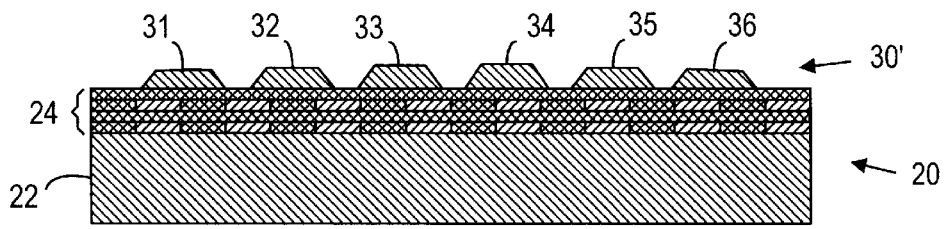
FIG. 4 is a diagrammatic representation illustrating the simplified bulk acoustic wave device after the thickness non-uniformity of the surface layer is reduced.

After being trimmed by the laser beam 115, the reduced top surface layer is denoted by reference numerals 30', as shown in FIG. 4. As shown, although the thickness of the resonators 31–36 may not be the same, the spread in the resonant frequency of the device 20 falls within the specification.

Figure 5A:
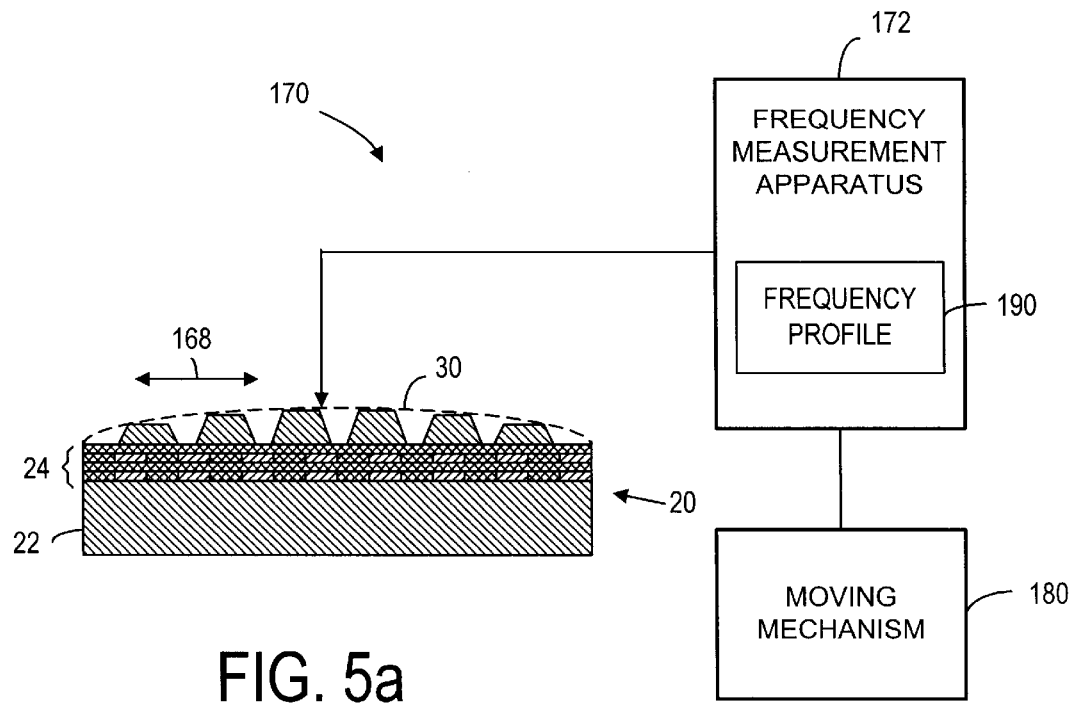
FIG. 5a is a diagrammatic representation illustrating a system for mapping the thickness non-uniformity profile of a bulk acoustic wave device, according to the present invention.

Prior to thickness adjustment of the topmost surface layer 30 of the device 20, as described in conjunction with FIGS. 3 and 4, it is preferred that the thickness profile of the device 20 be mapped. It is preferable to use a frequency measurement apparatus 172 to perform localized measurement of the resonant frequency of the device 20. It may be necessary to measure the resonant frequency of the individual resonators and/or filters of the device 20. It should be noted that, in order to measure the resonant frequency of those components, it is necessary to form and pattern the top electrode layer on the wafer. Based on the frequency profile 190, it is possible to calculate the amount of material to be removed from the upper surface layer 30. As shown in FIG. 5a, the profile mapping system 170 comprises a frequency measurement apparatus 172, and a moving mechanism 180 for moving the frequency measurement apparatus 172 relative to the device 20 for obtaining the frequency profile 190 of the surface. The movement direction of the frequency measurement apparatus 172 is represented by arrow 168. From the frequency profile 190 it is possible to obtain the thickness non-uniformity profile 192 (FIG. 6).

Figure 5B:
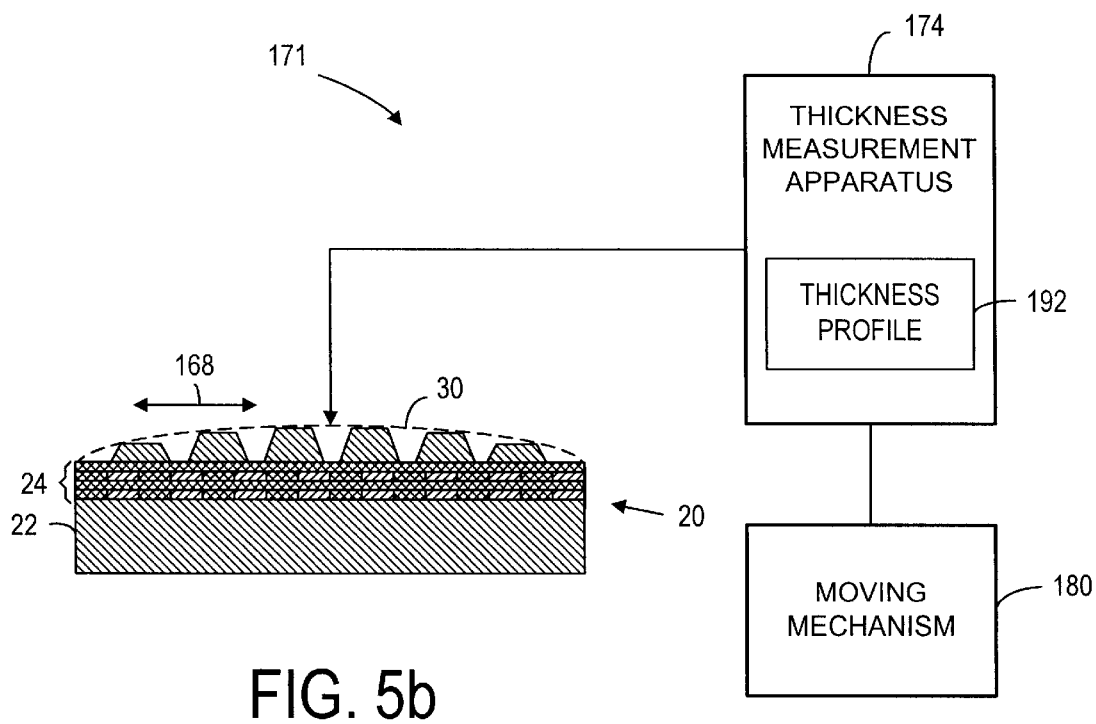
FIG. 5b is a diagrammatic representation illustrating another system for mapping the thickness non-uniformity of a bulk acoustic wave device, according to the present invention.

FIG. 5b is a diagrammatic representation illustrating a system 171 for mapping a bulk acoustic wave device 20 by measuring the physical thickness of the device. Instead of a frequency measurement apparatus 172, a thickness measurement apparatus 174 is used to measure the thickness of the device 20 and obtain the thickness non-uniformity profile 192 directly.

Figure 6:
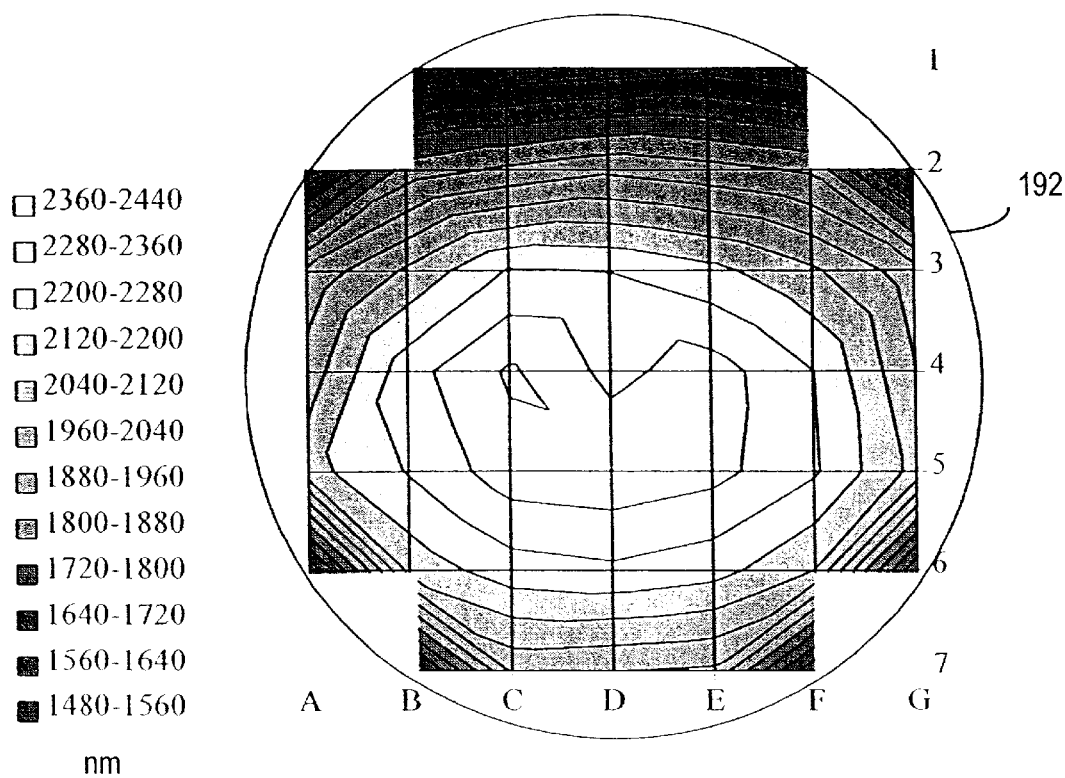
FIG. 6 is a thickness chart illustrating the non-uniformity profile of a wafer with a plurality of bulk acoustic wave generating and controlling layers fabricated thereon.

FIG. 6 is a thickness chart illustrating the non-uniformity thickness profile of a wafer with a plurality of acoustic wave generating and controlling layers fabricated thereon. In particular, FIG. 6 shows the non-uniformity profile of a piezoelectric (ZnO) layer expressed in terms of nanometers. If the average thickness is used as a reference, then the thickness variation across the layer is about ±23%. With such a large variation in thickness, the frequency variation across the wafer is usually not acceptable. Thus, the device must be tuned by adjusting the thickness of the device.

Figure 7:
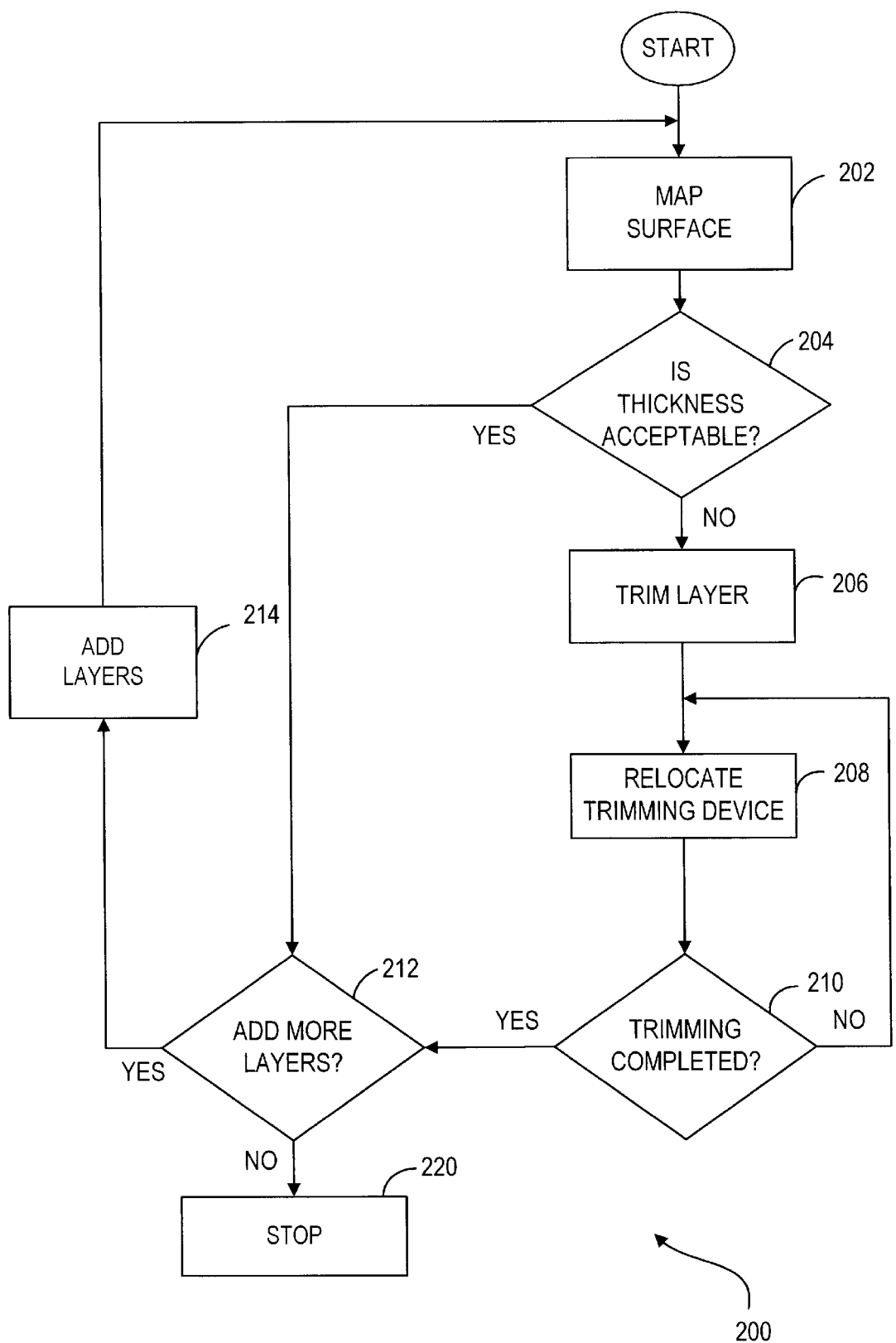
FIG. 7 is a flow chart illustrating the steps for tuning a bulk acoustic wave device at wafer level, according to the present invention.

FIG. 7 is a flow chart illustrating the process 200 for tuning a bulk acoustic wave device, according to the present invention. As shown at step 202, a frequency measurement apparatus (FIG. 5a) or a thickness measurement apparatus (FIG. 5b) is used to map the surface of the device 20. A thickness non-uniformity profile 192 is thus obtained. If the variations in surface thickness fall within a given tolerance, as determined at step 204, then it is not necessary to adjust the thickness of the mapped surface. However, new layers may be added on top of the mapped surface, depending on the determining step 212. Otherwise, the topmost layer 30 of the device 20 is trimmed locally by the laser beam 115 (FIG. 3), at step 206. At step 208, the laser beam is relocated relative to the device 20 to locally trim the topmost layer 30 at another location thereof. At step 210, it is determined whether the local trimming is completed. At step 212, it is determined whether more layers need to be fabricated to complete the device. After one or more new layers are added, at step 214, on top of the adjusted layer, the surface profile of the device is again mapped, at step 202, to determine whether the device is made according to the specification.

In summary, the present invention discloses a method and system for tuning the bulk acoustic wave device at a wafer, or die, level. The method and system, as disclosed, are particularly useful when the surface area of the wafer is sufficiently large such that the deposition of thin-film cannot achieve acceptable thickness uniformity. Tuning the frequency across the wafer by adjusting the thickness at localized areas of the wafer surface can increase the yield of the FBAR manufactory process.

It is known in the art that the fabrication of the top and bottom electrode layers, in general, involves one or more additional steps to make a pattern out of each of the electrode layers. It is preferred that the patterning steps are carried out before the thickness of the respective electrode layer is adjusted. However, it is also possible to carry out the patterning steps after the thickness adjustment.

It should be noted that the bulk acoustic wave devices, according to the present invention, include individual resonators, stacked crystal filters, ladder filters and the combinations thereof. However, there are other filter types in addition to the ladder structure that can be constructed from FBARs. All of them include some resonators, which have to be tuned, but they cannot be called parallel or shunt resonators in all cases. The balanced filter is an example of such a filter type.

Furthermore, the thickness non-uniformity, as described hereinabove, is related to the frequency non-uniformity of the BAW devices on the wafer. The purpose of trimming the surface layer is to reduce the frequency non-uniformity of the devices. Thus, trimming the surface layer does not necessarily make the topmost layer perfectly even. In other words, even if the topmost layer has a very uniform thickness, it might be necessary to trim it to correct for the non-uniformity of one or more of the underlying layers. For example, if the topmost layer is a top electrode layer overlying a piezoelectric layer which is not uniform, the purpose of trimming the top electrode layer is for reducing the frequency non-uniformity of the devices due to the thickness non-uniformity of the piezoelectric layer—even if the top electrode layer itself is uniform. The object of the present invention is to achieve the desired uniformity of the final frequency of the devices. Therefore, the surface layer can be a single layer, such as the top, bottom or piezoelectric layer, but the surface layer can also be a combination of layers, such as the combination of the top electrode layer and the piezoelectric layer.

Thus, although the invention has been described with respect to a preferred embodiment thereof, it will be understood by those skilled in the art that the foregoing and various other changes, omissions and deviations in the form and detail thereof may be made without departing from the spirit and scope of this invention.

What is claimed is:

1. A method of tuning a bulk acoustic wave device during a fabrication process thereof, wherein the bulk acoustic wave device comprises a plurality of acoustic wave generating and controlling layers formed on a substrate, and the acoustic wave generating and controlling layers include a bottom electrode layer, a piezoelectric layer, a top electrode layer and a passivation layer, one of which can be a surface layer of the bulk acoustic wave device during the fabrication process, and wherein the surface layer has a layer thickness with a non-uniformity profile defining a plurality of locations at which the thickness non-uniformity of the surface layer requires thickness adjustment, and wherein the bulk acoustic wave device has an operating frequency which varies partly with the layer thickness, and the operating frequency can be adjusted by adjusting the layer thickness, said method comprising the steps of:

providing an etching medium over the surface layer at one section thereof for locally adjusting, according to the thickness non-uniformity profile, the thickness of at least one of said plurality of locations;

relocating the etching medium, relative to the device, to another section of the surface layer for locally adjusting, according to the thickness non-uniformity profile, the thickness of at least another of said plurality of locations; and repeating the relocating until the thickness of substantially all of said plurality of locations according to the thickness non-uniformity profile has been adjusted.

2. The method of claim 1, wherein the etching medium is a laser beam.

3. The method of claim 2, wherein the device comprises a plurality of individual bulk acoustic wave components each having a top surface, wherein the top surface comprises a part of the surface layer at one of said plurality of locations, and wherein the laser beam is used to trim the top surface of the individual bulk acoustic wave components, one at a time.

4. The method of claim 3, wherein the surface layer is a piezoelectric layer.

5. The method of claim 3, wherein the surface layer is a passivation layer.

6. The method of claim 3, wherein the surface layer is a bottom electrode layer.

7. The method of claim 3, wherein the surface layer is a top electrode layer.

8. The method of claim 7, wherein the surface layer further comprises a passivation layer overlying at least a part of the top electrode layer.

9. The method of claim 3, wherein the individual bulk acoustic wave components comprise one or more resonators.

10. The method of claim 3, wherein the individual bulk acoustic wave components comprise one or more filters.

11. The method of claim 3, wherein the individual bulk acoustic wave components comprise one or more stacked crystal filters.

12. A method of tuning a bulk acoustic wave device during a fabrication process thereof, wherein the bulk acoustic wave device comprises a plurality of acoustic wave generating and controlling layers formed on a substrate, and the acoustic wave generating and controlling layers include a bottom electrode layer, a piezoelectric layer, a top electrode layer and a passivation layer, one of which can be a surface layer of the bulk acoustic wave device during the fabrication process, and wherein the surface layer has a layer thickness with a non-uniformity profile defining a plurality of locations at which the thickness non-uniformity of the surface layer requires thickness adjustment, and wherein the bulk acoustic wave device has an operating frequency which varies partly with the layer thickness, and the operating frequency can be adjusted by adjusting the layer thickness, said method comprising the steps of:

providing an etching medium over the surface layer at one section thereof for locally adjusting, according to the thickness non-uniformity profile, the thickness of at least one of said plurality of locations;

relocating the etching medium, relative to the device, to another section of the surface layer for locally adjusting, according to the thickness non-uniformity profile, the thickness of at least another of said plurality of locations; and repeating the relocating step until the thickness of substantially all of said plurality of locations according to the thickness non-uniformity profile have been adjusted, wherein said method further comprises the step of mapping the thickness non-uniformity profile of the surface layer prior to adjusting the thickness thereof.

13. A system for tuning a bulk acoustic wave device during a fabrication process thereof, wherein the bulk acoustic wave device comprises a plurality of acoustic wave generating and controlling layers formed on a substrate, and the acoustic wave generating and controlling layers include a bottom electrode layer, a piezoelectric layer, a top electrode layer and a passivation layer, one of which can be a surface layer of the bulk acoustic wave device during the fabrication process, and wherein the surface layer is made of a surface material having a layer thickness with a non-uniformity profile defining a plurality of locations at which the thickness non-uniformity of the surface layer requires thickness adjustment, and wherein the bulk acoustic wave device has an operating frequency which varies partly with the layer thickness, and the operating frequency can be adjusted by adjusting the layer thickness, said system comprising:

means, positioned above a section of the surface layer, for locally adjusting, according to the thickness non-uniformity profile, the thickness of at least one of said plurality of locations; and means, engaging with the thickness adjusting means, for relocating the thickness adjusting means, relative to the device, to another section of the surface layer for locally adjusting, according to the thickness non-uniformity profile, the thickness of at least another of said plurality of locations.

14. The system of claim 13, wherein the thickness adjusting means comprises a laser for providing a laser beam for removing the surface material.

15. A system for tuning a bulk acoustic wave device during a fabrication process thereof, wherein the bulk acoustic wave device comprises a plurality of acoustic wave generating and controlling layers formed on a substrate, and the acoustic wave generating and controlling layers include a bottom electrode layer, a piezoelectric layer, a top electrode layer and a passivation layer, one of which can be a surface layer of the bulk acoustic wave device during the fabrication process, and wherein the surface layer is made of a surface material having a layer thickness with a non-uniformity profile defining a plurality of locations at which the thickness non-uniformity of the surface layer requires thickness adjustment, and wherein the bulk acoustic wave device has an operating frequency which varies partly with the layer thickness, and the operating frequency can be adjusted by adjusting the layer thickness, said system comprising:

means, positioned above a section of the surface layer, for locally adjusting, according to the thickness non-uniformity profile, the thickness of at least one of said plurality of locations; and means, engaging with the thickness adjusting means, for relocating the thickness adjusting means, relative to the device, to another section of the surface layer for locally adjusting, according to the thickness non-uniformity profile, the thickness of at least another of said plurality of locations, wherein said system further comprises means for mapping the thickness non-uniformity profile of the surface layer prior to adjusting the thickness thereof.

16. The system of claim 15, wherein the mapping means comprises a frequency measurement apparatus for measuring the frequency of the device at various locations thereof for providing the thickness non-uniformity profile.

* * * * *

UNITED STATES PATENT AND TRADEMARK OFFICE
CERTIFICATE OF CORRECTION

PATENT NO.     : 6,462,460 B1
DATED          : October 8, 2002
INVENTOR(S)    : Tikka et al.

It is certified that error appears in the above-identified patent and that said Letters Patent is hereby corrected as shown below:

Column 1,
Line 29, please delete "a".

Column 6,
Line 25, after "thereof", please insert -- . --.

Signed and Sealed this

Fifteenth Day of April, 2003

JAMES E. ROGAN
*Director of the United States Patent and Trademark Office*